United States Patent
van Duuren et al.

(10) Patent No.: US 11,670,394 B2
(45) Date of Patent: Jun. 6, 2023

(54) TEMPERATURE EXPOSURE DETECTION BASED ON MEMORY CELL RETENTION ERROR RATE

(71) Applicant: NXP B.V., Eindhoven (NL)

(72) Inventors: Michiel Jos van Duuren, Valkenswaard (NL); Guido Jozef Maria Dormans, Bemmel (NL); Anirban Roy, Austin, TX (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/405,633

(22) Filed: Aug. 18, 2021

(65) Prior Publication Data

US 2023/0056133 A1 Feb. 23, 2023

(51) Int. Cl.
  *G11C 7/04* (2006.01)
  *G11C 29/42* (2006.01)
  *G11C 29/44* (2006.01)

(52) U.S. Cl.
  CPC ............. *G11C 29/42* (2013.01); *G11C 7/04* (2013.01); *G11C 29/4401* (2013.01); *G11C 2207/2254* (2013.01)

(58) Field of Classification Search
  CPC ....... G11C 29/42; G11C 7/04; G11C 29/4401; G11C 2207/2254
  USPC .............................................. 365/185.09, 158
  See application file for complete search history.

(56) References Cited

U.S. PATENT DOCUMENTS

| | | | | |
|---|---|---|---|---|
| 6,162,684 A | * | 12/2000 | Chang | H01L 29/40114 438/266 |
| 9,691,980 B1 | * | 6/2017 | Lin | G11C 13/0097 |
| 9,881,682 B1 | * | 1/2018 | Tang | G11C 16/3427 |
| 9,904,479 B1 | * | 2/2018 | Chen | G11C 16/3431 |
| 10,048,898 B2 | * | 8/2018 | Yang | G06F 3/0647 |
| 10,101,214 B2 | | 10/2018 | Jedema et al. | |
| 10,147,876 B1 | * | 12/2018 | Huang | H01L 45/144 |
| 10,410,730 B1 | * | 9/2019 | Boenapalli | G06F 12/0246 |
| 10,529,400 B1 | | 1/2020 | Mahatme et al. | |
| 10,978,130 B1 | * | 4/2021 | Wong | G11C 11/2293 |
| 11,029,889 B1 | * | 6/2021 | Sharon | G11C 16/08 |
| 11,056,211 B1 | * | 7/2021 | Puthoor | G11C 29/88 |
| 11,210,031 B1 | * | 12/2021 | Mekhanik | G06F 3/0679 |
| 2002/0021599 A1 | * | 2/2002 | Peter | G11C 16/3418 365/200 |
| 2007/0077664 A1 | | 4/2007 | Chung et al. | |

(Continued)

FOREIGN PATENT DOCUMENTS

| | | |
|---|---|---|
| KR | 20040042122 A | 5/2004 |
| WO | 2007002161 A2 | 1/2007 |

OTHER PUBLICATIONS

Jang, J., "Self-Correcting STTRAM under Magnetic Field Attacks", 2015 52nd ACM/EDAC/IEEE Design Automation Conference (DAC), Jun. 8-12, 2015.

(Continued)

*Primary Examiner* — Michael T Tran

(57) ABSTRACT

A temperature exposure detection system includes a plurality of nonvolatile memory cells. The memory includes memory read circuitry for reading the plurality of memory cells to determine a data retention error rate of the plurality of memory cells. The temperature exposure detection system determines a temperature exposure of the system based on the determined data retention error rate.

20 Claims, 7 Drawing Sheets

(56) References Cited

U.S. PATENT DOCUMENTS

| | | | |
|---|---|---|---|
| 2007/0159868 A1* | 7/2007 | Sugita | G11C 13/0033 365/100 |
| 2008/0158970 A1* | 7/2008 | Sekar | G11C 7/04 365/185.27 |
| 2011/0205823 A1* | 8/2011 | Hemink | G11C 11/5642 365/185.18 |
| 2013/0061101 A1* | 3/2013 | Fitzpatrick | G11C 29/50004 714/E11.03 |
| 2013/0163342 A1* | 6/2013 | Dutta | G11C 11/5628 365/185.21 |
| 2014/0047301 A1* | 2/2014 | Kurata | G06F 1/3275 714/773 |
| 2014/0208174 A1* | 7/2014 | Ellis | G11C 29/50004 714/721 |
| 2014/0242796 A1* | 8/2014 | Toba | H01L 27/0922 438/682 |
| 2014/0269048 A1* | 9/2014 | Chen | G11C 16/10 365/185.2 |
| 2015/0052416 A1* | 2/2015 | Prohofsky | G11C 29/50004 714/773 |
| 2015/0085575 A1* | 3/2015 | Tam | G11C 29/50004 365/185.11 |
| 2015/0193302 A1* | 7/2015 | Hyun | G11C 29/028 714/764 |
| 2015/0310938 A1* | 10/2015 | Kim | G11C 29/42 714/721 |
| 2016/0027523 A1 | 1/2016 | Zhao et al. | |
| 2016/0255063 A1* | 9/2016 | Zhang | G06F 11/079 713/168 |
| 2016/0351270 A1* | 12/2016 | Ehrlich | G11C 16/3418 |
| 2016/0377674 A1* | 12/2016 | Bickford | G05B 19/4188 324/750.01 |
| 2017/0139761 A1* | 5/2017 | Song | G06F 12/02 |
| 2017/0229176 A1* | 8/2017 | Kurotsuchi | G11C 11/1675 |
| 2017/0262198 A1* | 9/2017 | Nakata | G11C 16/102 |
| 2017/0271574 A1* | 9/2017 | Inokuchi | G11C 11/1655 |
| 2018/0181454 A1* | 6/2018 | Lin | G06F 3/0653 |
| 2018/0197619 A1* | 7/2018 | Chen | G11C 11/5628 |
| 2018/0374548 A1* | 12/2018 | Achtenberg | G06F 11/1072 |
| 2019/0065331 A1* | 2/2019 | Singidi | G11C 29/832 |
| 2019/0339881 A1* | 11/2019 | Scott, III | G06F 1/206 |
| 2020/0073451 A1* | 3/2020 | Nowell | G06F 1/206 |
| 2020/0192759 A1* | 6/2020 | Hwang | G11C 29/52 |
| 2020/0310910 A1* | 10/2020 | Saito | G06F 11/1068 |
| 2020/0310930 A1* | 10/2020 | Tzoufras | G11C 29/42 |
| 2020/0395087 A1* | 12/2020 | Banerjee | G11C 16/14 |
| 2021/0263821 A1* | 8/2021 | Yang | G11C 29/021 |
| 2022/0091975 A1* | 3/2022 | Muchherla | G06F 12/0873 |
| 2022/0115074 A1* | 4/2022 | Teoh | G11C 16/26 |
| 2022/0149068 A1* | 5/2022 | Liu | H01L 23/5226 |
| 2022/0206821 A1* | 6/2022 | Devegowda | G06F 9/4401 |

OTHER PUBLICATIONS

Sengupta, A., "Magnetic Tunnel Junction as an On-Chip Temperature Sensor", Scientific Reports, www.nature.com/scientificreports, Published Sep. 18, 2017.

Yang, H.F., "The Magnetic Tunnel Junction as a Temperature Sensor for Buried Nanostructures", Abstract Only, Journal of Applied Physics, vol. 124, Issue 17, Nov. 5, 2018.

* cited by examiner

TEMPERATURE EXPOSURE DETECTION BASED ON MEMORY CELL RETENTION ERROR RATE

BACKGROUND OF THE INVENTION

Field of the Invention

This invention relates in general to temperature exposure detection based on memory cell data retention error rate.

Description of the Related Art

Nonvolatile memories are utilized for storing data including during times when the memory is not powered.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a temperature exposure detection system includes a plurality of nonvolatile memory cells. The memory includes memory read circuitry for reading the plurality of memory cells to determine a data retention error rate of the plurality of memory cells. The temperature exposure detection system determines a temperature exposure of the system based on the determined data retention error rate In some embodiments, reading nonvolatile memory cells to determine a retention error rate that correlates to a particular temperature exposure profile may provide for a system that can monitor temperature exposure without having to be powered.

Figure 1:
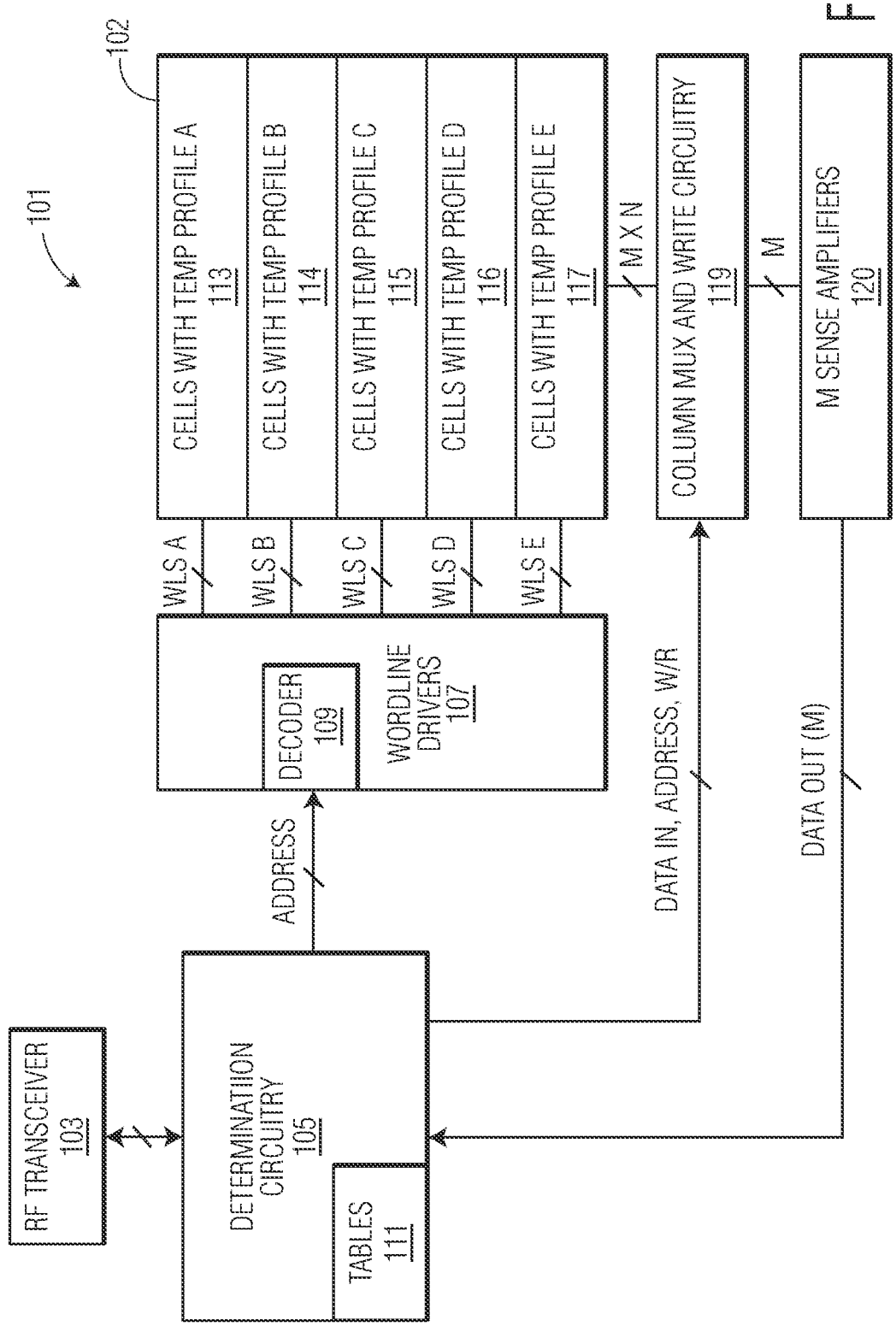
FIG. 1 is a circuit diagram of a temperature exposure detection system according to one embodiment of the present invention.

FIG. 1 is a temperature disclosure detection system 101 according to one embodiment of the present invention. System 101 includes an array of nonvolatile memory cells 102 that are arranged in rows and columns. In the embodiment shown, array 102 includes 5 subarray portions of cells (cell groups 113-117) where each subarray portion has cells with a different temperature dependent data retention error rate profile (A-E). A cells temperature dependent data retention error rate profile is based on physical aspects of the cell which define the cell's propensity to retain a stored data state over a range of exposed temperatures.

System 101 includes wordline driver circuitry 107 which includes a decoder 109 and a plurality of wordline drivers each connected to a wordline (WLS A-WLS E) of a row of array 102. Circuitry 107 asserts a wordline to a row of array 102 to access memory cells of the row for a memory read or write operation. In the embodiment shown, wordlines WLS A are for accessing cells of a row in the sub array portion of cell group 113, wordlines WLS B are for accessing cells of a row in the sub array portion of cell group 114, wordlines WLS C are for accessing cells of a row in the sub array portion of cell group 115, wordlines WLS D are for accessing cells of a row in the sub array portion of cell group 116, and wordlines WLS E are for accessing cells of a row in the sub array portion of cell group 117. Decoder 109 receives a portion of a memory address (ADDRESS) from determination circuitry 105 and activates the wordline driver of circuitry 107 corresponding to the received address to assert the wordline of the cells of the address.

System 101 includes column mux and write circuitry 119 for writing data to cells of array 102 for memory operations. Circuitry 119 receives a portion of an address (ADDRESS) from determination circuitry 105 where a decoder of circuitry 119 controls column multiplexers of circuitry 119 to direct the columns of the cells of an address to the write circuitry of circuitry 119 to be written to during a memory operation. In the embodiment shown, the column multiplexers of circuitry 119 also direct the columns of the cells of an address to the sense amplifiers 120 for reading data of those cells during a read operation.

In the embodiment shown, system 101 includes an M number of sense amplifiers 120 for reading M number of cells during a data read operation. There are M number of N-to-1 column multiplexers in circuitry 119 for redirecting the columns to the sense amplifiers and write circuitry during read and write operations. M may be any number such as 8, 16, 32, 35, 64, 128 etc. N may be of one of a number such as 2, 8, 9, 12, 16, 32, 64 etc. Also, circuitry 119 may include termination circuitry for terminating the unselected columns during a read or write operation. In some embodiments, circuitry 119 would not include column multiplexers where every column would include its own sense amplifier. In one embodiment, array 102 has 500 rows were each group of cells 113-117 is located in 100 rows of array 102 which row having 100 cells, however the number rows and/or cells may be different in different embodiments.

In some embodiments, the specific circuitry implemented for circuitry 119, sense amplifiers 120, and circuitry 107 would depend upon the type of nonvolatile memory cells of array 102. In other embodiments, each group of cells 113-117 be located in a separate array with each array having a corresponding wordline driver circuitry, column mux and write circuitry, and sense amplifiers. In some embodiments, the cells of the different groups would be located in different columns where the different cell groups would share the same wordlines.

In the embodiment shown, determination circuitry 105 generates the ADDRESS values, memory operation commands (e.g. W/R), and write data (DATA IN) for performing a read or write memory operation. Circuitry 105 also receives the read data (DATA OUT) from the sense amplifiers (120) during a memory read operation. In the embodiment shown, circuitry 105 includes a memory (tables 111) for storing data that correlates data retention error rates determined from the memory reads of each cell group with temperature exposure profiles of the cells groups. In some embodiments where only one data state is written (e.g. all 0s) during a programing operation, DATA IN lines would not be located between circuitry 105 and circuitry 119. In such an embodiment, the write circuitry would be configured to place the cells in the single data state based on the write signal during a programming operation.

In some embodiments, circuitry 105 may include a processor core for performing the write operations, read operations, and for determining the temperature exposure information based on the read values. In other embodiments, circuitry 105 may include discrete circuitry (e.g. counters, comparators, adders, shifters) for performing at least some of the operations. In still other embodiments, circuitry 105 may include a combination of both processor cores and discrete circuitry. Also, in some embodiments, determination circuitry may include circuitry that performs other operations for a system that includes system 101 such as a system controller. In some embodiments, circuitry 105 may include a processor core for performing the memory operations and a separate processor core for determining the temperature exposure information. In some embodiments, the different processor cores (or discrete circuitry) may be located on different integrated circuits or in different component housings.

In the embodiment shown, system 101 includes a transceiver 103 for communicating wirelessly with a controller (e.g. controller 705 in FIG. 7) for receiving commands to provide temperature exposure information and to program the system. Transceiver 103 also provides the temperature exposure information wirelessly to the controller. In other embodiments, system 101 would include I/O circuitry for receiving and providing data by a wired connection with a controller.

Examples of nonvolatile memory types cells utilized in system 101 include MRAM, ReRAM, FeRAM, flash, or phase change memories. In some embodiments, all of the memory cells of system 101 would be the same memory cell type. However, systems of other embodiments may include cells of more than one memory cell type. In some embodiments, memory cell types that have a temperature dependent data retention error rate profile where data retention varies widely with temperature exposure may be better suited for use in a temperature exposure detection monitoring system.

In some embodiments, system 101 may include memory cells characterized as bi-stable memory cells. With bi-stable memory cells, the cell generally resides at one of two stable memory states. For example, with some MRAM cells, the cell will be stable in either one memory state or another memory state, depending upon the magnetic polarization of the ferromagnetic free layer of the magnetic tunnel junction of the MRAM cell. See FIG. 2 and its corresponding description. Another type of bi-stable nonvolatile memory cell is an FeRAM memory cell.

In some embodiments, using data retention error rates as measured by memory reads to determine temperature exposure information may advantageously be useful for bi-stable nonvolatile memory cell types in that a specific degree of temperature exposure of the material of a specific memory cell cannot be easily measured due to the bi-state nature of the cell. In some embodiments, utilizing bi-stable cells over other types of memory cells may allow for a data retention error rate determination to be made by a less complicated process in that it may be performed digitally in a more simplified manner.

Figure 2:
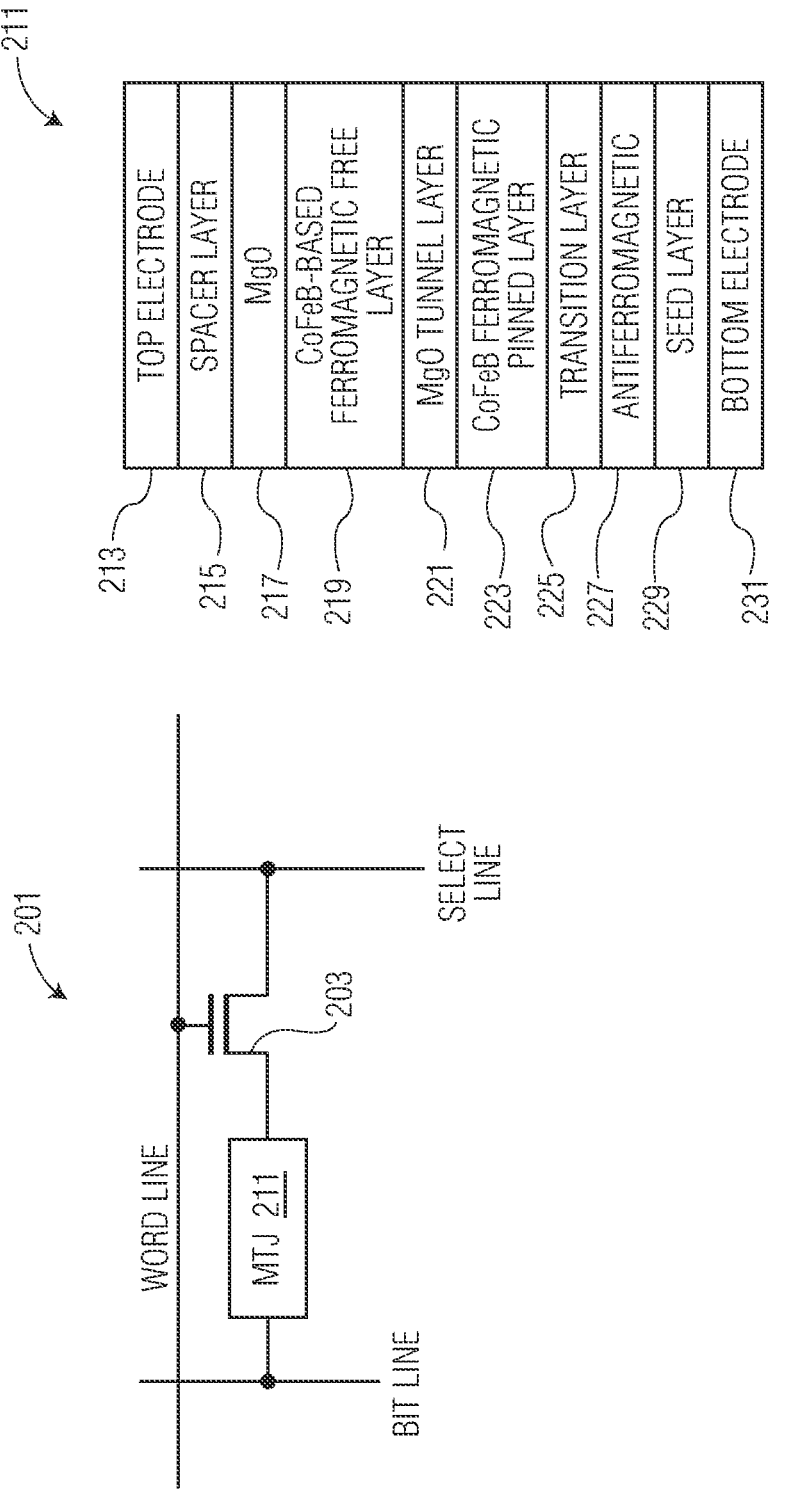
FIG. 2 is a schematic of an MRAM cell.

FIG. 2 is a block diagram of an MRAM memory cell 201 according to one embodiment of the present invention that may be implemented in array 102 of system 101. Cell 201 includes a magnetic tunnel junction (MTJ) 211 and includes a select transistor 203 whose gate is connected to a wordline. When asserted, the wordline makes transistor 203 conductive to provide a path between the bit line of the column and the source line of the column through MTJ 211. Depending upon the storage state of MTJ 211, MTJ 211 either provides a higher resistance indicating one memory state or a lower resistance indicating a second state.

FIG. 2 also shows a block diagram of MTJ 211. In the embodiment shown, MTJ 211 has several layers located between bottom electrode 231 and top electrode 213. In one embodiment, MTJ 211 is located in the interconnect portion of an integrated circuit between two metal layers where bottom electrode 231 is a portion of a metal interconnect in a lower metal layer and electrode 213 is a portion of a metal interconnect in an upper metal layer.

In one embodiment, the stack of layers of MTJ 211 are formed by the sequential deposition and patterning during the formation of the interconnect portion of an integrated circuit. In one embodiment, each of the layers are patterned to have a cylindrical shape, but may have other shapes in other embodiments. Located on bottom electrode 231 is a seed layer 229 which is deposited for the formation of an antiferromagnetic material layer 227, which in one embodiment is of a synthetic antiferromagnetic material. A transition layer 225 is located on layer 227. A ferromagnetic pinned layer 223, which in the embodiment shown is made of CoFeB, is located on layer 225. A tunnel layer 221, which in the embodiment shown in made of MgO, is located on pinned layer 223. A ferromagnetic free layer 219, which in the embodiment shown is made of a CoFeB based ferromagnetic material, is located on tunnel layer 221. Layer 217 of MgO is located on free layer 219, and spacer layer 215 is located between layer 217 and electrode 213. Other embodiments may include MTJs of other configurations and/or made of other materials. For example, In some embodiments, the free layer and/or pin layer may include FeB and Ta. In some embodiments, the free layer and/or pinned layer may be a composite layer of different materials.

In some embodiments, the magnetic polarization direction of the pinned layer 223 is fixed. The magnetic polarization direction of free layer 219 can be set to either a direction parallel to the magnetic polarization direction of the pinned layer 223 for a low resistive state or a direction anti parallel to the magnetic polarization direction of pinned layer 223 for a high resistive state. This type of MRAM cell is considered bi-stable in that there are only two detectable stable magnetic polarization directions of the free layer 219 with respect to the fixed layer 223 (parallel and antiparallel). In some embodiments, the magnetic polarization direction of free layer 219 is set by providing a current at a sufficient magnitude through MTJ 211, where the direction of the current flow through MTJ 211 sets the magnetic polarization direction of the free layer 223 to the desired direction to store the desired value. MJTs of other embodiments may be written to or read from in other ways. In some embodiments, the magnetic polarization direction of the pinned layer is fixed in the plane of the MTJ. In other embodiments, the magnetic polarization direction of the pinned layer is fixed perpendicular to the plane of the MTJ.

The temperature dependent data retention error rate profile of an MTJ (the propensity of the cell to retain its programmed magnetic state and therefore its programmed data over a range of temperatures) may depend upon several factors of an MTJ. For example, differences in the thickness of the ferromagnetic layers 219 and 223 and differences in the lateral cross-sectional area of the ferromagnetic layers 219 and 223 may affect the thermal stability and therefore the temperature range in which the free layer 219 is able to retain its programmed magnetic polarization direction. For example, a cell with a thinner free layer may make the cell more likely to retain its programmed state at a particular temperature than a similar cell with a thicker free layer. In other embodiments, the cells of the different cell groups (113-117) could be made with different lateral cross-sectional areas of the MTJs to provide for a different temperature dependent data retention error profile for each group. For example, cells with a greater lateral cross-sectional area of the MTJ would be more likely to retain its programmed state at a particular temperature than a similar cell with smaller lateral cross-sectional area. In some embodiments, the lateral cross-sectional area of an MTJ or layer of an MTJ is the cross-sectional area of the MTJ or layer in a plane that is generally parallel with the interfacial areas between the layers of the MTJ. In the embodiment of FIG. 2, the lateral cross-sectional area of MTJ 211 is the area of the MTJ in a plane defined from left to right and into and out of the page, relative to the view of MTJ cell 211 in FIG. 2. In other embodiments, the number of MgO layers of an MTJ may affect thermal stability of the cell.

Figure 3:
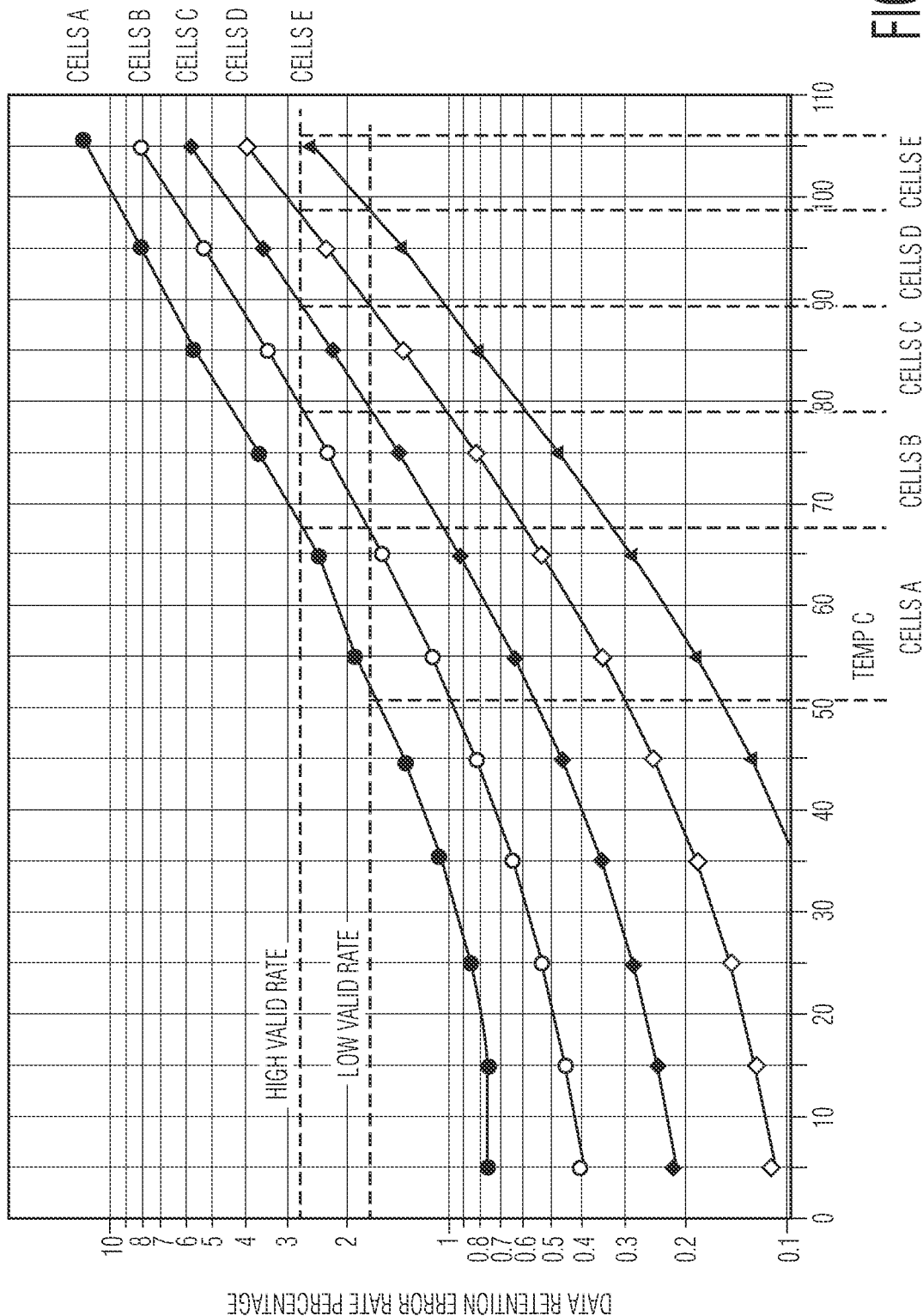
FIG. 3 is a chart showing a correlation between temperature exposure and retention error rates for cell groups according to one embodiment of the present invention.

FIG. 3 is a chart showing a correlation between temperature exposure and data retention error rates for groups of cells according to one embodiment of the present invention. As shown in FIG. 3, each of the five cell groups (113-117) (labeled CELLS A-CELLS E) have a different temperature dependent data retention error rate profile which provides for different data retention error rates when exposed to the same temperatures for the same period of time. As shown in FIG. 3, the memory cells of group A have the high susceptibility to changing data states after being exposed at a particular temperature (are the least thermally stable) whereas the cells of group E have the lowest susceptibility to changing data states (are the most thermally stable).

In one embodiment, the MJTs of the cells of group E would have the largest lateral cross-sectional area and the MJTs of the cells of group A would have the smallest lateral cross-sectional area. The lateral cross-sectional areas of the MJTs of the cells of groups D, C, and B would be located in between. In another embodiment, the free layer of the cells of group E would be the thinnest and the free layer of the cells of group A would be the thickest.

As shown in the graph of FIG. 3, as the cells are exposed to higher temperatures, the data retention error rate rise. Accordingly, by measuring the data retention error rate by performing data reads of programmed data stored in the cells, an indication can made as to the temperatures that the cells were exposed to.

In some embodiments, the correlation between temperature exposure and data retention error is strongest for data retention error rates within a certain range. In the embodiment shown in FIG. 3, that range is between the HIGH VALID RATE (approximately 2.9 percent error rate) and the LOW VALID RATE (approximately 1.8 percent error rate). Accordingly, in some embodiments of a system with multiple cell groups, the system may determine temperature exposure from the error rate of the cell group or cell groups that fall in the valid error range. As shown in the graph of FIG. 3, for exposure temperatures between 51 and 67 degrees C., a system will use the error rate of the cells of group A to determine temperature exposure. For temperatures between 67 and 79 degrees C., the system will use the error rate of the cells of group B to determine temperature exposure. For temperatures between 79 and 89 C, the system will use the cells of group C to determine temperature exposure. For temperatures between 89 and 99 degrees C., the system will use the cells of group D to determine temperature exposure. For temperatures between 99 and 109 degrees C., the system will use the cells of group E to determine temperature exposure.

In some embodiments, a system may use more than one group of cells to determine temperature exposure. For example, if two groups were to have an error rate within a valid error range, then the temperature exposure indicated by both groups would be averaged to obtain resultant temperature exposure data. In some embodiments, all the cells of the temperature exposure detection system have the same temperature dependent data retention error rate profile wherein temperature exposure data would be determined from just one curve.

Figure 4:
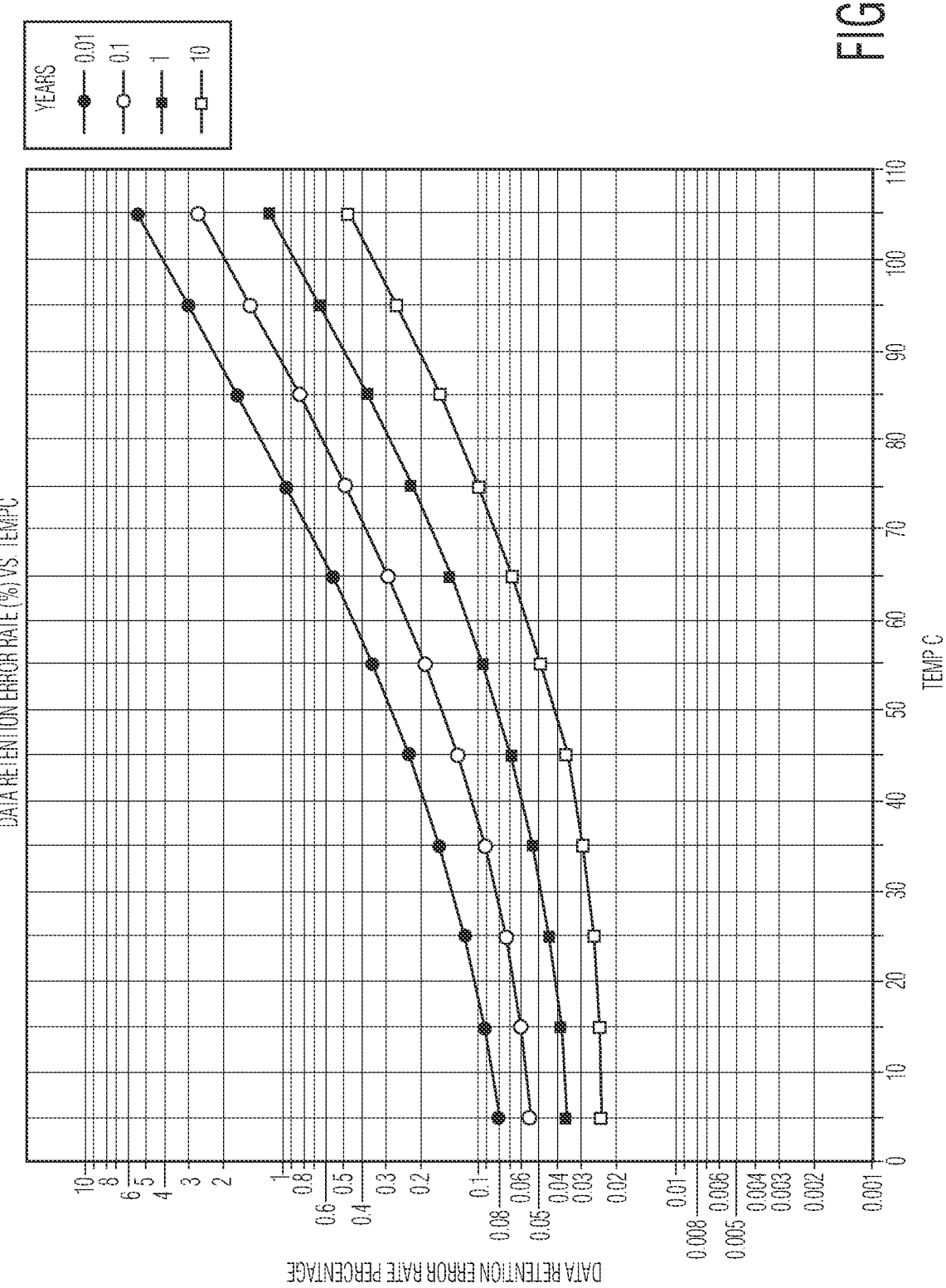
FIG. 4 is a chart showing a correlation between temperature exposure and retention error rates over time according to one embodiment of the present invention.

FIG. 4 is a chart showing the relationship between data retention error rates of nonvolatile memory cells and temperature exposure and how those rates change based on the time after programming. In some embodiments, the longer data is stored in a memory cell, the greater the probability the data will flip states. As shown in the embodiment of FIG. 4, this increase in data retention error rates holds across all temperatures. Accordingly, a temperature exposure detection system may take into account the time from last programming in order to determine temperature exposure based on measured data retention error rates.

In some embodiments, temperature exposure information may be indicative of the highest temperature that a system is exposed to. In other embodiments, temperature exposure information may indicate a cumulative amount of time of exposure at elevated temperatures. The amount of time that memory cells need to be exposed at a certain temperature for data retention error rates to rise may be a factor in what the temperature exposure information is indicative of. In some embodiments, the cells of cell group A (113) may be more indicative of a peak temperature in that they are more susceptible to switching where the cells of group E (117) may be more indicative of a cumulative exposure to extreme temperatures.

With some items being monitored, a short momentary exposure to a very high temperature may not be as harmful as a prolonged exposure at lower temperatures. In some embodiments, it may be desirable to closely match the temperature dependent data retention error rate profiles of the cells of a system with the harmful temperature exposure profile of the products being monitored at least for the valid ranges of data retention error rates.

Figure 5:
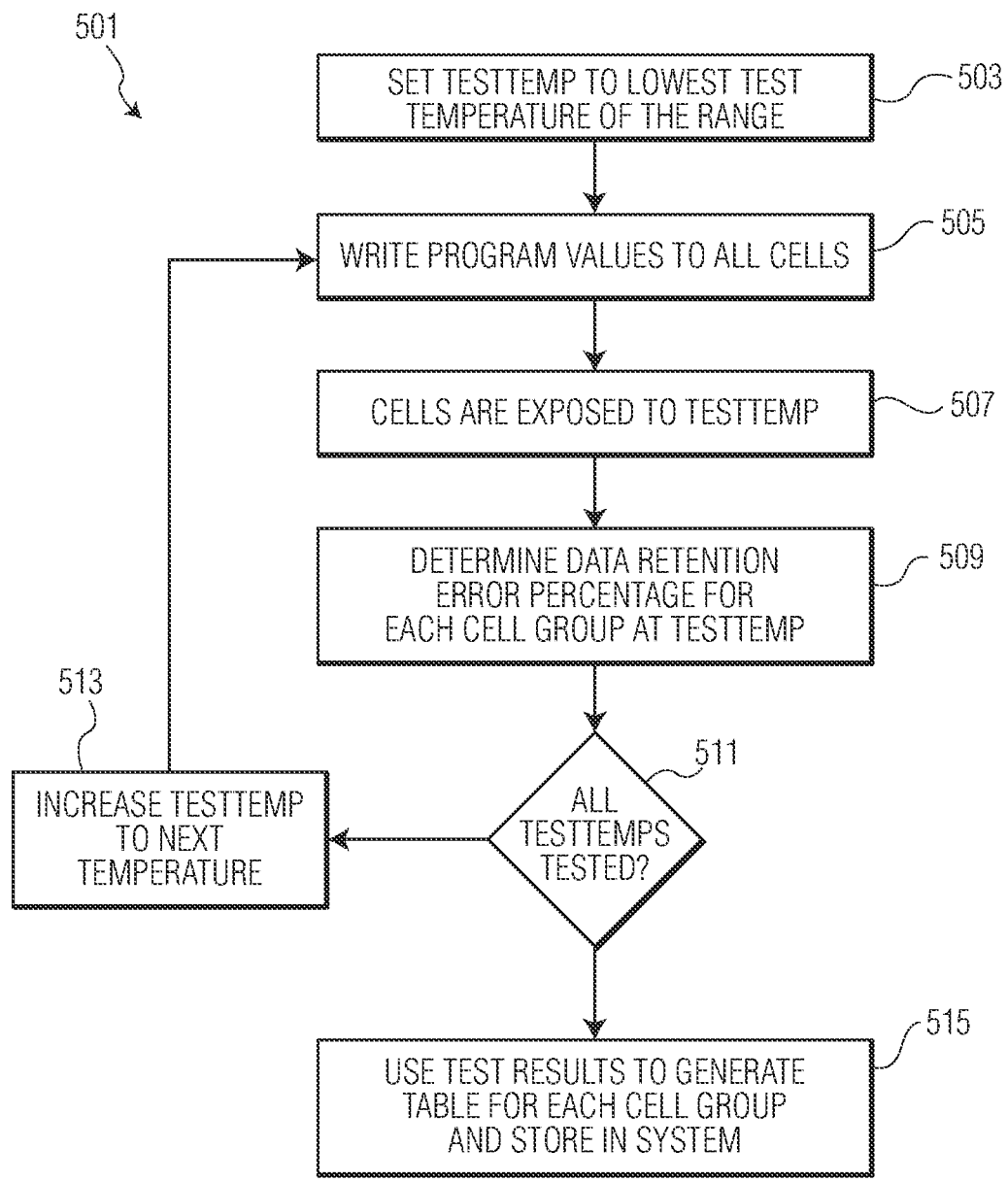
FIG. 5 is a flow chart of a calibration routine for a temperature exposure detection system according to one embodiment of the present invention.

FIG. 5 sets forth a calibration routine for setting data retention error rate/temperature exposure correlation information for a temperature exposure detection system according to one embodiment of the present invention. During the routine, the system is exposed to a range of temperatures, where the data retention error rates are determined after exposure to each temperature by a read of the nonvolatile memory cells of the system.

At operation 503, the test temperature (TESTTEMP) is set to the lowest temperature of the test range. In operation 505, the memory cells of the system are programmed to a predefined set of values, which in one embodiment is all 0s, but in other embodiments may be all 1s or a pattern of 1s and 0s. In operation 507, the cells are exposed to the TESTTEMP temperature for a predetermined period of time. Afterwards, the cells are read to determine the data retention error rate for each cell group. In one embodiment, the system reads all the cells of the array and compares the read values to the predefined values (e.g. all 0's) written in operation 505. The number of incorrect read bits of a cell group is divided by the total number of bits of the cell group to determine an error rate percentage for the cell group at that temperature. In operation 511, if not all of the temperatures of the range have been tested, TESTTEMP is increased to the next temperature in the range in operation 513 and operations 505, 507 and 509 are performed again until all temperatures in the range have been tested. In operation 515, the test results are used to generate data retention error rates/temperature exposure correlation data for storing in a memory (e.g. tables 111) of a temperature exposure determination system.

In some embodiments, routine 501 would be performed after manufacturing and prior to sale of the system. In some embodiments, routine 501 would be performed on a small subset of manufactured systems where the resultant correlation data would be programmed into the memories of the other manufactured systems. In still other embodiments, initial correlation data would be programmed into the memory (e.g. tables 111) of a system. Afterwards, the system would be calibrated at one temperature, where the measured results at the one temperature would be used to adjust the initial correlation data programmed in the memory. In some embodiments (e.g. that utilize MRAM cells), initial correlation data may be obtained from switching models, where a thermal stability factor of the cells is extracted by extrapolation of off-state conditions, i.e. zero magnetic field, zero current and ambient temperature. In other embodiments, a system may be calibrated in other ways.

Figure 6:
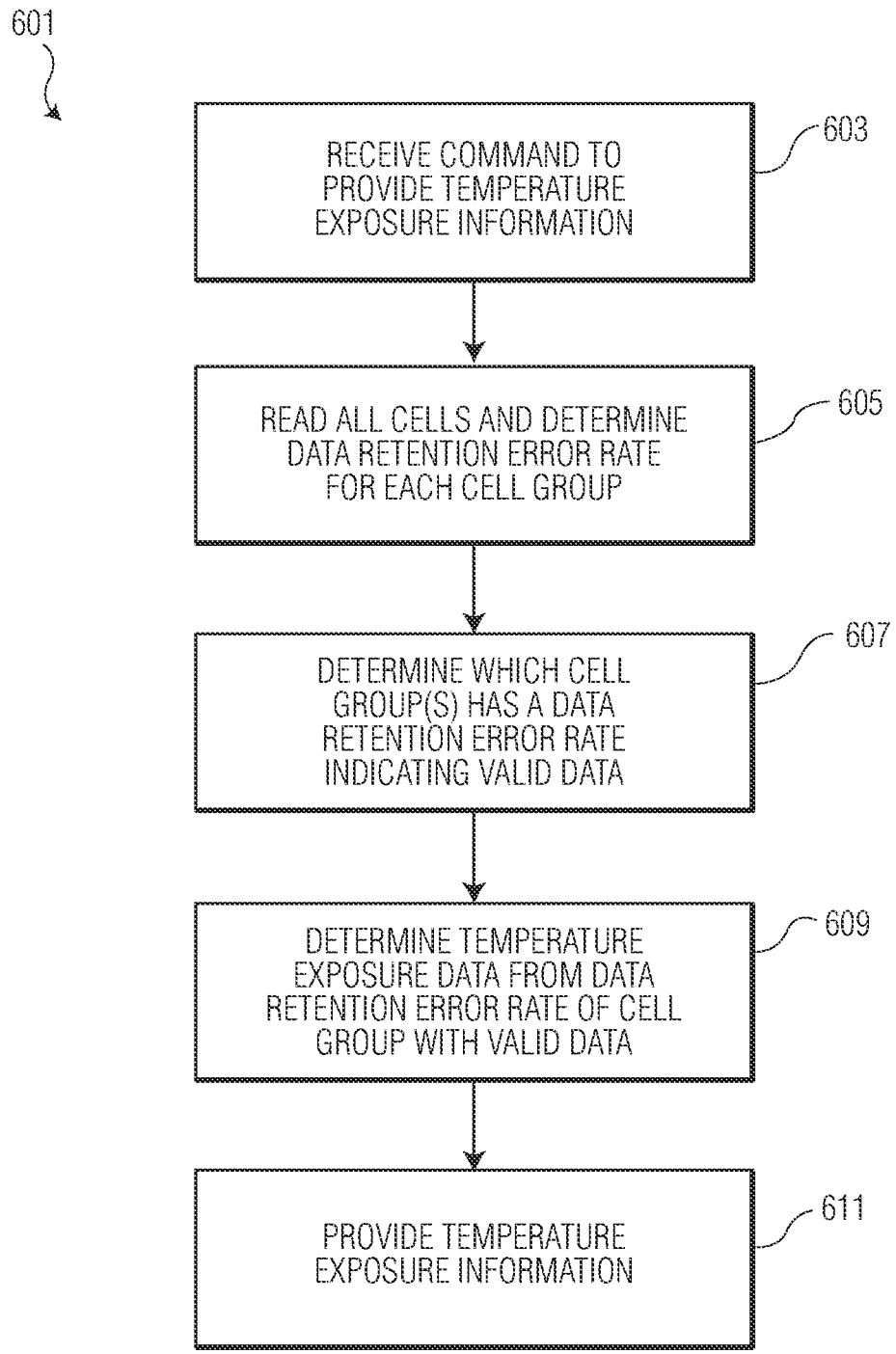
FIG. 6 is a flow chart of a routine for determining temperature exposure according to one embodiment of the present invention.

FIG. 6 is a flow chart of a routine 601 for determining temperature exposure by a temperature exposure detection system (e.g. 101) as per one embodiment of the present invention. In operation 603, system 101 receives a command (e.g. via RF receiver 103) to provide temperature exposure information. In operation 605, determination circuitry 105 preforms a read on all of the cells of array 102 and determines the data retention error rate for each cell group (113-117). In operation 607, determination circuitry 105 determines which cell group or groups of cell groups (113-117) has a data retention error rate within a valid range (e.g. 2.8-3.8% in FIG. 3). In operation 609, determination circuitry 105 determines the temperature exposure information from the data retention error rate of the cell group(s) with data in the valid range. In operation 611, the temperature exposure information is provided to the requestor (e.g. controller 705 in FIG. 7) e.g. via RF receiver 103. In other embodiments, a temperature exposure monitoring system may determine and provide temperature exposure in other ways.

Figure 7:
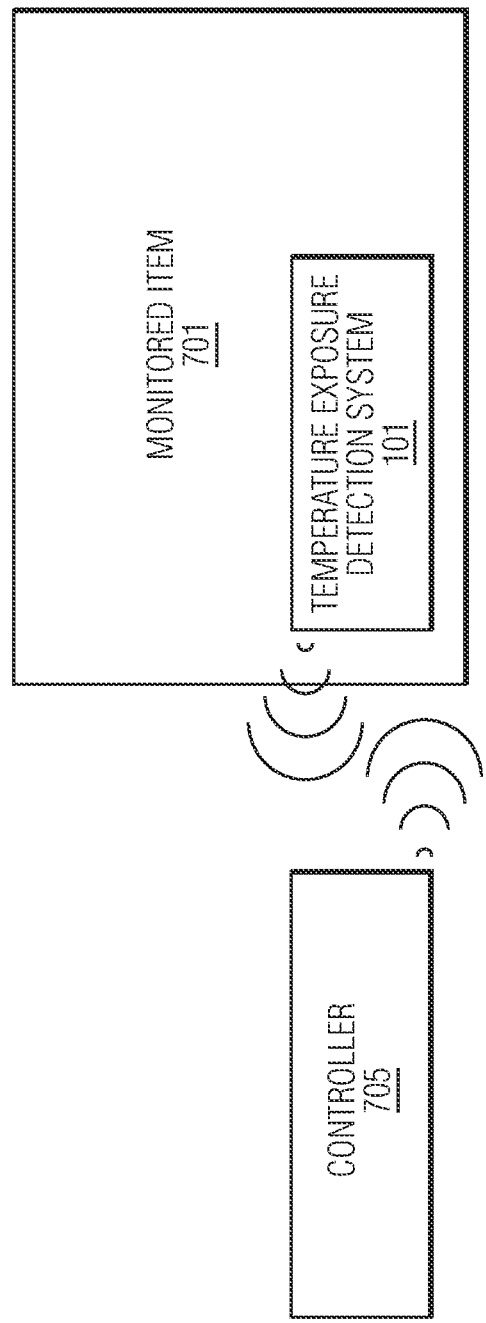
FIG. 7 is a block diagram of a temperature exposure monitoring system and a monitored item according to one embodiment of the present invention.

FIG. 7 is a block diagram showing temperature exposure detection system 101 being attached to an item 701 being monitored. Item 701 can be any product for which it is desirable to determine what temperatures the item has been exposed to. For example, item 701 can be batteries, food, beverages, plastics, medicines, vaccines, chemical substances, or electronic equipment or components. For some products, it may be desirable to determine temperatures that an item was exposed to prior to the sale of the item e.g. as when an item is sitting in a warehouse or during transit. Such information can be used in determining whether warranty or product usage conditions were complied with. In other embodiments, the information may be used to determine the conditions that raw materials where subject to for determining whether to alter manufacturing processes. In other embodiments, such information can be used to determine whether a product is nearing end of life or should be replaced.

In one embodiment, system 101 is implemented in a tag that is attached to the item or package container. In other embodiments, system 101 may be part of the electronics of item 701. In still other embodiments, system 101 would be integrated with the package container such as enclosed within a liquid container.

Controller 705 is used to program system 101 to begin monitoring temperature exposure, to request temperature exposure information regarding the item, and to reset system 101 to begin monitoring for a second period. In the embodiment shown, controller 705 exchanges information with system 101 wirelessly, although in other embodiments, that information may be exchanged via a wired communication link (not shown). Controller 705 may be a portable device such as a handheld inventory scanner, laptop, or cell phone or it may a stationary device such as a scanner, manufacturing tool, or desktop computer. In some embodiments, different devices may be used to program, read, and reset system 101. In some embodiments, the some of the determination operations may be performed by controller 705. In some embodiments, the different nonvolatile memory cell groups may be located in different integrated circuits of a temperature exposure detection system.

In some embodiments, because system 101 utilizes nonvolatile memory cells to determine temperature exposure of an item, system 101 can monitor temperature exposure even when not powered up. Accordingly, such a system can monitor temperature for items when they are not powered or for items that are not configured to be powered (e.g. food, liquids). Also, because the memory cells are reprogrammable, a system can be reused to monitor multiple items. For example, system 101 can be incorporated into a barrel and can be reset to monitor temperature each time the barrel is filled.

Features specifically shown or described with respect to one embodiment set forth herein may be implemented in other embodiments set forth herein.

In one embodiment, a temperature exposure detection system includes a plurality of nonvolatile memory cells, read circuitry for reading the plurality of nonvolatile memory cells, and determination circuitry that determines a data retention error rate of the plurality of nonvolatile memory cells based on a read of the plurality of nonvolatile memory cells and determines temperature exposure of the system based on the determined data retention error rate of at least some of the plurality of nonvolatile memory cells.

In another embodiment, a method of determining temperature exposure of a system, includes reading a plurality of nonvolatile memory cells of the system, determining a data retention error rate of the plurality of nonvolatile memory cells based on a read of those memory cells, and determining temperature exposure of the system based on the determined data retention error rate of at least some of the plurality of nonvolatile memory cells.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A temperature exposure detection system comprising:
a plurality of nonvolatile memory cells, the plurality of nonvolatile memory cells including a plurality of groups of memory cells, wherein memory cells of each group of the plurality of groups have a different temperature dependent data retention error rate profile than memory cells of the other groups of the plurality of groups, and wherein memory cells of each group of the plurality of groups have a layer with a thickness that is different than a thickness of a corresponding layer in memory cells of the other groups of the plurality of groups;
read circuitry for reading the plurality of nonvolatile memory cells;
determination circuitry that determines a data retention error rate of the plurality of nonvolatile memory cells based on a read of the plurality of nonvolatile memory cells and determines temperature exposure of the system based on the determined data retention error rate of at least some of the plurality of nonvolatile memory cells.

2. The system of claim 1 further wherein each of the plurality of nonvolatile memory cells is characterized as a bi-stable state memory cell.

3. The system of claim 1 wherein the memory cells of the plurality of nonvolatile memory cells are characterized as MRAM cells.

4. The system of claim 1 wherein the memory cells of the plurality of nonvolatile memory cells are characterized as FeRAM cells.

5. The system of claim 1 wherein memory cells of each group of the plurality of groups have a structure with a lateral cross-sectional area that is different than a lateral cross-sectional area of a corresponding structure in memory cells of the other groups of the plurality of groups.

6. The system of claim 5 wherein the structure is characterized as at least a portion of an MTJ of an MRAM cell.

7. The system of claim 1 wherein the determination circuitry determines the temperature exposure of the system based on the determined data retention error rate of at least one group of the plurality that is determined to have a retention error rate within a particular retention error rate range.

8. The system of claim 1 wherein the determination circuitry determines the temperature exposure of the system based on an amount of time that specific data has been stored in the at least some of the plurality of nonvolatile memory cells.

9. The system of claim 1 wherein the temperature exposure of the system is indicative of an amount of time that the system has been exposed to a temperature that meets or exceeds a particular temperature threshold value.

10. The system of claim 1 wherein the determination circuitry includes a memory with a plurality of temperature exposure values correlated with data retention error rate values for memory cells of the plurality of nonvolatile memory cells.

11. The system of claim 10 wherein a correlation of the plurality of temperature exposure values with the data retention error rate values in the memory is based on a calibration procedure of the system which exposes the system to at least one temperature and determining a data retention error rate of at least some of the plurality of nonvolatile memory cells after an exposure to the at least one temperature.

12. A method of determining temperature exposure of a system, the method comprising:
reading a plurality of nonvolatile memory cells of the system, the plurality of nonvolatile memory cells including a plurality of groups of memory cells, wherein memory cells of each group of the plurality of groups have a different temperature dependent data retention error rate profile than memory cells of the other groups of the plurality of groups, and wherein memory cells of each group of the plurality of groups have a layer with a thickness that is different than a thickness of a corresponding layer in memory cells of the other groups of the plurality of groups;
determining a data retention error rate of the plurality of nonvolatile memory cells based on a read of those memory cells;
determining temperature exposure of the system based on the determined data retention error rate of at least some of the plurality of nonvolatile memory cells.

13. The method of claim 12 wherein the memory cells of the plurality of nonvolatile memory cells are characterized as MRAM cells.

14. The method of claim 12 wherein memory cells of each group of the plurality of groups have a structure with a lateral cross-sectional area that is different than a lateral cross-sectional area of a corresponding structure in memory cells of the other groups of the plurality of groups.

15. The method of claim 14 wherein the structure is characterized as at least a portion of an MTJ.

16. The method of claim 12 wherein the determining temperature exposure of the system based on the determined retention error rate includes determining the temperature exposure of the system based on the determined retention error rate of at least one group of the plurality of groups that is determined to have a retention error rate within a particular retention error rate range.

17. A temperature exposure detection system comprising:
a plurality of nonvolatile memory cells;
read circuitry for reading the plurality of nonvolatile memory cells; and
determination circuitry that determines a data retention error rate of the plurality of nonvolatile memory cells based on a read of the plurality of nonvolatile memory cells and determines temperature exposure of the system based on the determined data retention error rate of at least some of the plurality of nonvolatile memory cells, the determination circuitry including a memory with a plurality of temperature exposure values correlated with data retention error rate values for memory cells of the plurality of nonvolatile memory cells, wherein a correlation of the plurality of temperature exposure values with the data retention error rate values in the memory is based on a calibration procedure of the system which exposes the system to at least one temperature and determining a data retention error rate of at least some of the plurality of nonvolatile memory cells after an exposure to the at least one temperature.

18. The system of claim 17 further wherein each of the plurality of nonvolatile memory cells is characterized as a bi-stable state memory cell.

19. The system of claim 17 wherein the memory cells of the plurality of nonvolatile memory cells are characterized as MRAM cells.

20. The system of claim 17 wherein the memory cells of the plurality of nonvolatile memory cells are characterized as FeRAM cells.

\* \* \* \* \*